US005340320A

United States Patent [19]

Puerner

[11] Patent Number: 5,340,320

[45] Date of Patent: Aug. 23, 1994

[54] SHIELD FOR A HEADER HAVING RIGHT ANGLE ELECTRICAL TERMINALS

[75] Inventor: Dean A. Puerner, Maracopa, Ariz.

[73] Assignee: The Whitaker Corporation, Wilmington, Del.

[21] Appl. No.: 83,159

[22] Filed: Jun. 25, 1993

[51] Int. Cl.[5] .......... H05K 1/00

[52] U.S. Cl. .......... 439/79; 439/686

[58] Field of Search .......... 439/78, 79, 80, 607, 439/686, 689, 693, 695, 701

[56] References Cited

U.S. PATENT DOCUMENTS

| | | | |
|---|---|---|---|
| 4,050,769 | 9/1977 | Ammon | 339/196 M |
| 4,469,387 | 9/1984 | McHugh | 439/79 |
| 4,533,203 | 8/1985 | Feldman et al. | 339/176 M |
| 4,806,109 | 2/1989 | Manabe et al. | 439/607 |
| 4,842,528 | 6/1989 | Frantz | 439/80 |
| 4,921,442 | 5/1990 | Puerner | 439/499 |
| 4,952,172 | 8/1990 | Barkus et al. | 439/79 |
| 4,955,819 | 9/1990 | Harting et al. | 439/79 |
| 5,037,334 | 8/1991 | Viselli et al. | 439/733 |
| 5,080,604 | 1/1992 | Rider et al. | 439/357 |
| 5,088,937 | 2/1992 | Gabany | 439/581 |
| 5,112,233 | 5/1992 | Lybrand | 439/79 |
| 5,129,831 | 7/1992 | Locati | 439/79 |
| 5,147,225 | 9/1992 | Kile et al. | 439/680 |
| 5,158,471 | 10/1992 | Fedder et al. | 439/79 |
| 5,161,996 | 11/1992 | Locati | 439/374 |
| 5,161,999 | 11/1992 | Broschard, III et al. | 439/567 |
| 5,167,531 | 12/1992 | Broschard, III et al. | 439/540 |
| 5,199,886 | 4/1993 | Patterson | 439/79 |

FOREIGN PATENT DOCUMENTS

| | | |
|---|---|---|
| 2095485A | 9/1982 | United Kingdom . |
| 2219148A | 11/1989 | United Kingdom . |

OTHER PUBLICATIONS

AMP Catalog #82271 (Rev. Nov. 1991); "AMP AMPOWER Wave Crimp System"; (2 pages); AMP Incorporated, Harrisburg, Pa.

*Primary Examiner*—Larry I. Schwartz
*Assistant Examiner*—Hien D. Vu

[57] ABSTRACT

A safety shield 10 for a header 11 which has right angle electrical terminals 12. The header 11 has a lateral notch 14 and openings 15 formed therein. The safety shield 10 has a body 20 with a ledge 22 and pins 23 formed thereon. The ledge 22 on the safety shield 10 is received in the notch 14 on the header 11 and the pins 23 on the safety shield 10 are received in the openings 15 in the header 11. Latching fingers 24 formed on the safety shield 10 engage the header 11 to secure the safety shield 10 to the header 11.

4 Claims, 4 Drawing Sheets

Fig. 1
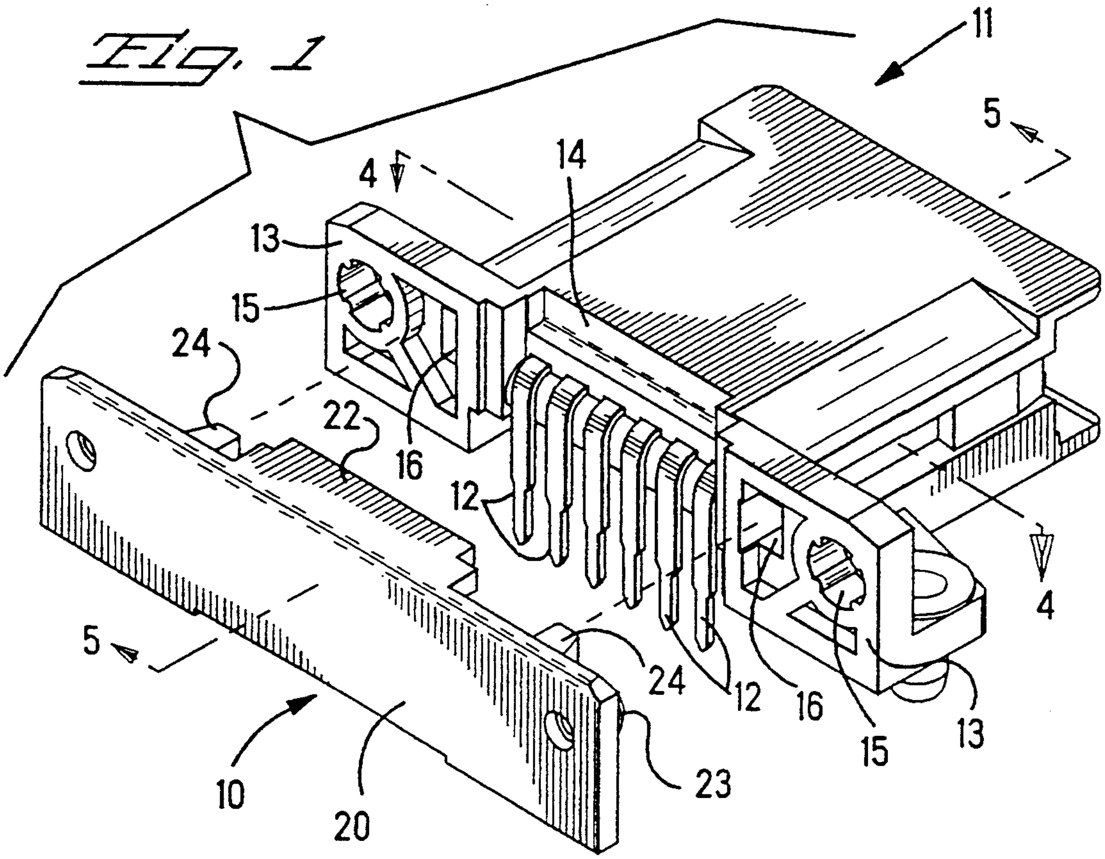
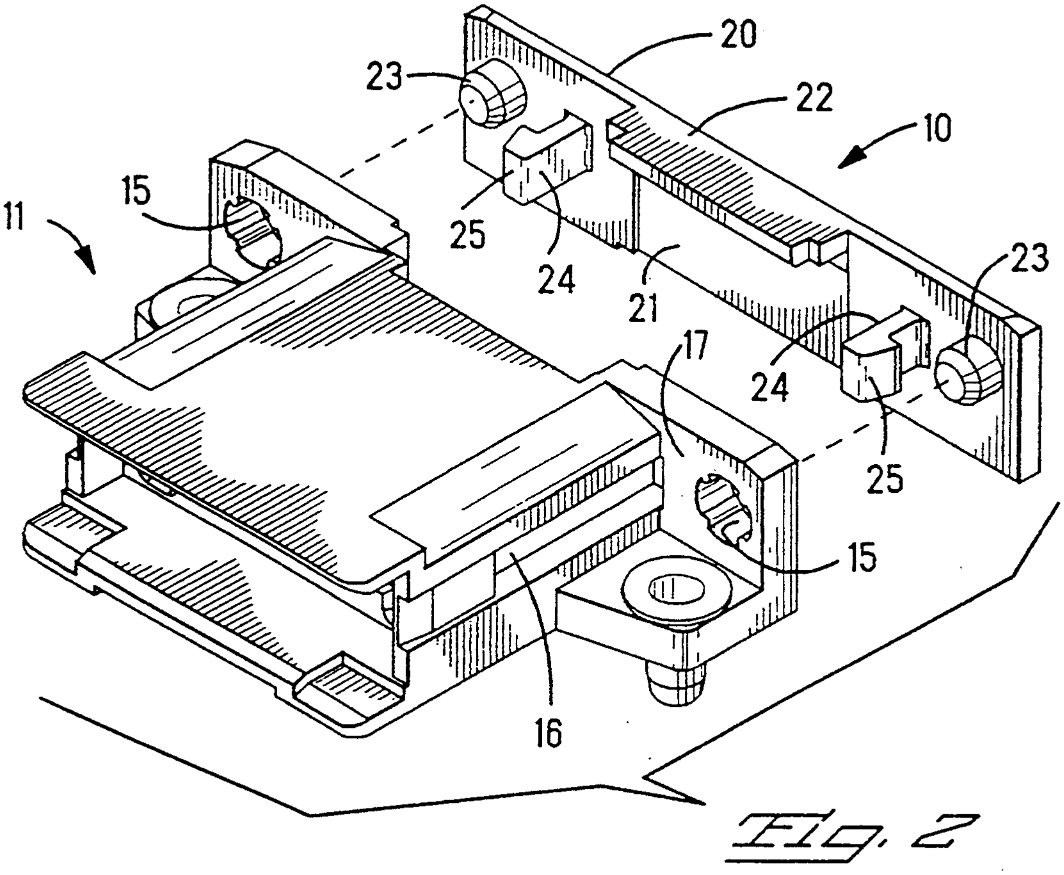
Fig. 2

SHIELD FOR A HEADER HAVING RIGHT ANGLE ELECTRICAL TERMINALS

FIELD OF THE INVENTION

The present invention relates to headers having electrical terminals at a right angle, and more particularly, to a safety shield to cover and protect the electrical terminals.

BACKGROUND OF THE INVENTION

Headers having electrical terminals bent at an angle of approximately 90° from the end of the header are commonly used in the electrical and electronic industry as, for example, on the end of a circuit board. The electrical terminals are usually unprotected and are subject to damage and may collect dust and debris which could interfere with the electrical operations. Also, there is a potential safety problem that persons working with the equipment may inadvertently touch the electrical terminals and receive an electrical shock.

Thus, there is a need for a simple, cost effective means to effectively shield the right angle bend electrical terminals to assure the safety of persons using electrical equipment and to reduce the accumulation of dust and debris on the electrical terminals.

SUMMARY OF THE INVENTION

It is an object of the present invention to provide a protective cover for the electrical terminals that are bent at approximately 90° from the end of a header.

It is a further object of the present invention to provide a cost effective safety shield that is simply and rapidly connected to exposed electrical terminals on a 90° header.

In accordance with the teachings of the present invention, there is disclosed herein a safety shield for a header, wherein electrical terminals extending from an end of the header are bent at an angle of approximately 90° from the end of the header. The shield protects the electrical terminals from inadvertent access. The end of the header has a lateral notch formed therein, the notch extending over the electrical terminals. The safety shield includes a body having a center portion. A ledge is formed at approximately the center portion of the body. The ledge extends outwardly at approximately a right angle to the body. Means are provided to connect the safety shield to the end of the header. The body extends laterally across the end of the header. In this manner the ledge on the body is received in the notch in the header and the electrical terminals extending from the end of the header are covered.

BRIEF DESCRIPTION OF THE DRAWINGS

FIG. 1 is an exploded perspective view of the safety shield being connected to the header showing the right angle bend electrical terminals and the front of the safety shield and of the header.

FIG. 2 is an exploded perspective view of the safety shield being connected to the header showing the back of the safety shield and the back of the header.

DESCRIPTION OF THE PREFERRED EMBODIMENTS

Figure 3:
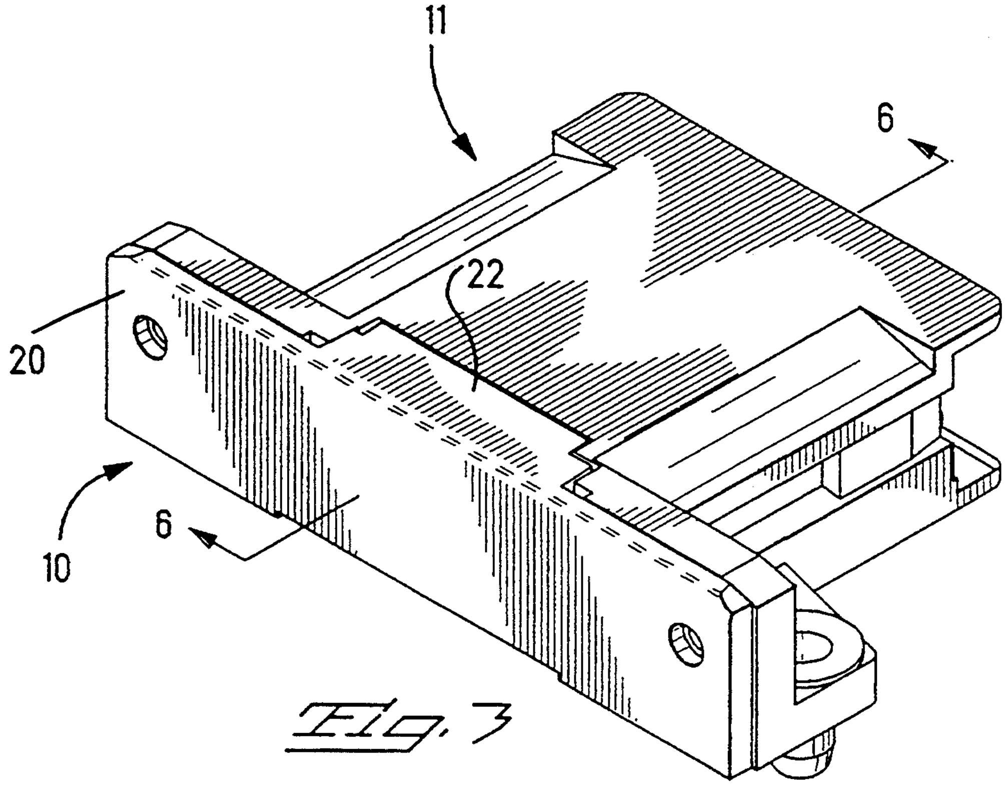
FIG. 3 is a perspective view of the safety shield connected to the header.

Referring now to FIGS. 1-6, a safety shield 10 is connected to a header 11 which has a plurality of electrical terminals 12 extending outwardly and bent at an angle of approximately 90° from the end 13 of the header 11. The end 13 of the header has a lateral notch 14 formed in the end 13 directly above the electrical terminals 12. Preferably, the notch extends laterally so that all of the electrical terminals 12 are disposed below the notch 14. The end 13 of the header 11 also has formed therein a pair of openings 15, each opening being disposed on opposite sides of the electrical terminals 12. Also formed in the end 13 of the header 11 on opposite sides of the electrical terminals 12 are at least a pair of channels 16, one on each side of the terminals 12. Each channel 16 has a latching face 17 therein.

Figure 4:
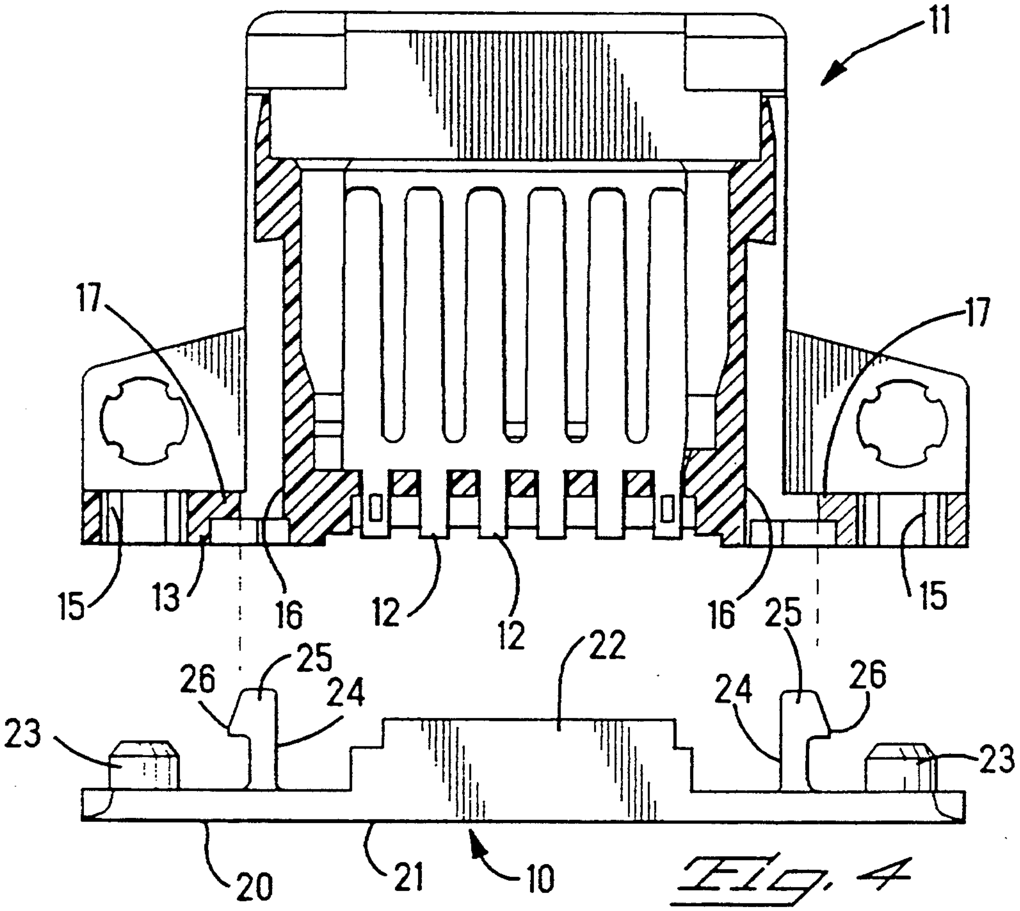
FIG. 4 is a cross-sectional view taken across the lines 4—4 of FIG. 1.
Figure 5:
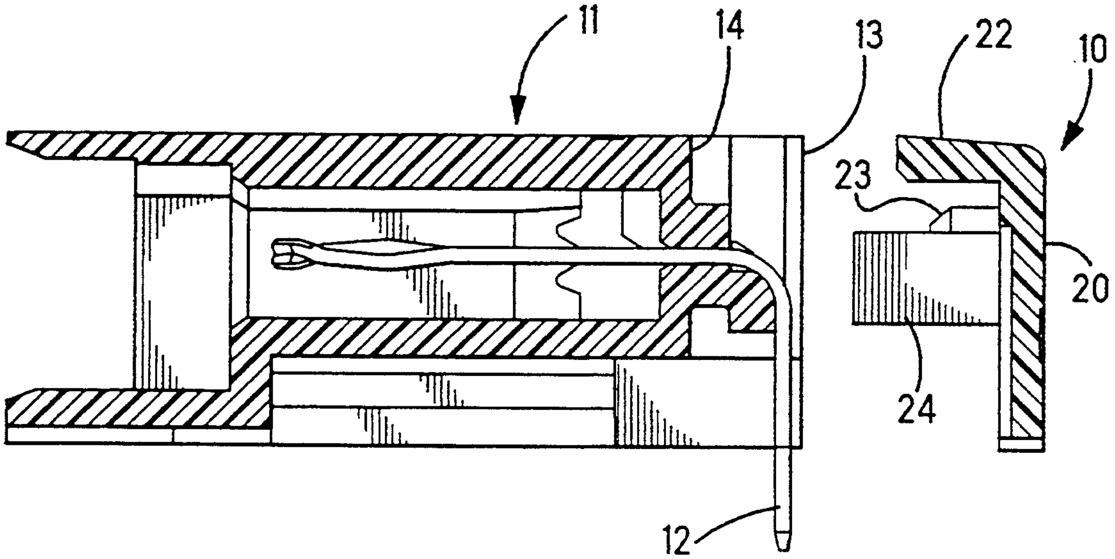
FIG. 5 is a cross-sectional view taken across the lines 5—5 of FIG. 1.
Figure 6:
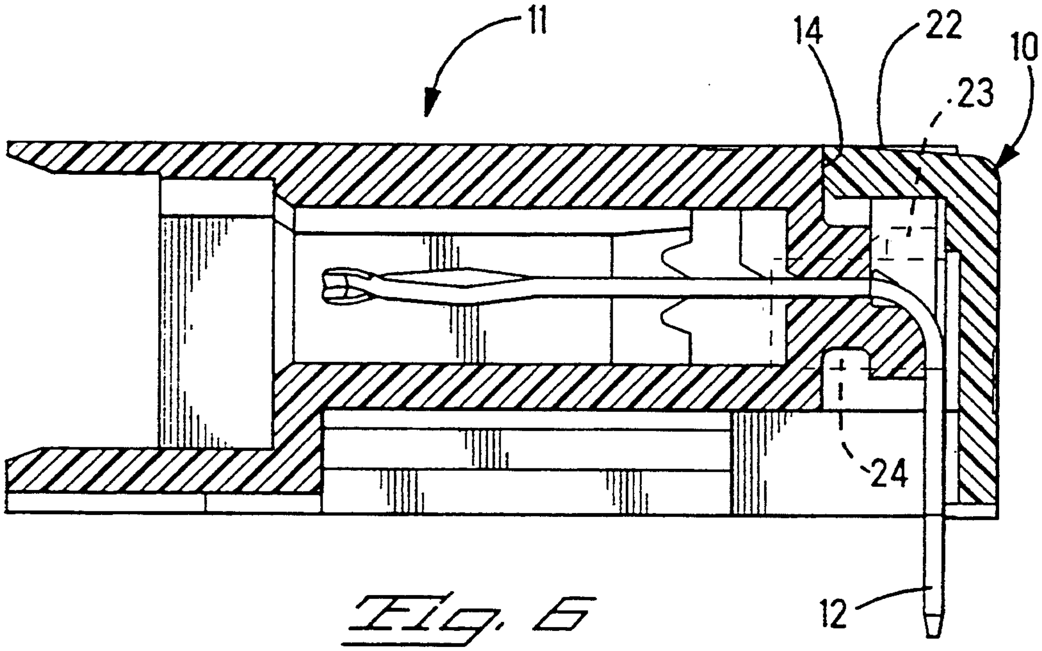
FIG. 6 is a cross-sectional view taken across the lines 6—6 of FIG. 3.

The safety shield 10 has a body 20 which has a center portion 21. A ledge 22 is formed on the center portion 21 of the body 20. The ledge 22 extends outwardly at approximately a 90° angle from the body 20. Preferably, the ledge 22 is disposed on the edge of the safety shield 10. A pair of pins 23 are formed on the body 20, the pins 23 being disposed on opposite sides of the ledge 22 as seen in FIGS. 2 and 4. Also formed on the body 20 are at least a pair of flexible latching fingers 24, one being disposed on each side of the ledge 22, and preferably being disposed between the ledge 22 and the respective pins 23 on the body 20. Each latching finger 24 is in the shape of an L with the leg of the L connected to the body 20 and the base 25 of the L being distal from the body 20 as best seen in FIGS. 2 and 4. The base 25 is formed with an obtuse angle angling from the base 25 toward the body 20.

The safety shield 10 is slid into the end 13 of the header 11 wherein the pins 23 on the safety shield 10 are received in, and cooperate with, the openings 15 in the end 13 of the header 11. This pin/opening configuration secures the safety shield 10 to the header 11. The safety shield 10 is effectively butted against the end 13 of the header 11.

To further secure the safety shield 10 to the header 11 and to preclude easy removal of the safety shield 10, the base 25 of the respective latching finger 24 on the body 20 is guided into the respective channel 16 in the end of the header 11 by the angled base 25 of the latching finger 24. The base 25 of the L-shaped latching finger 24 is thereby hooked in the channel 16 against the latching face 17 as shown in FIGS. 3-6.

Figure 7:
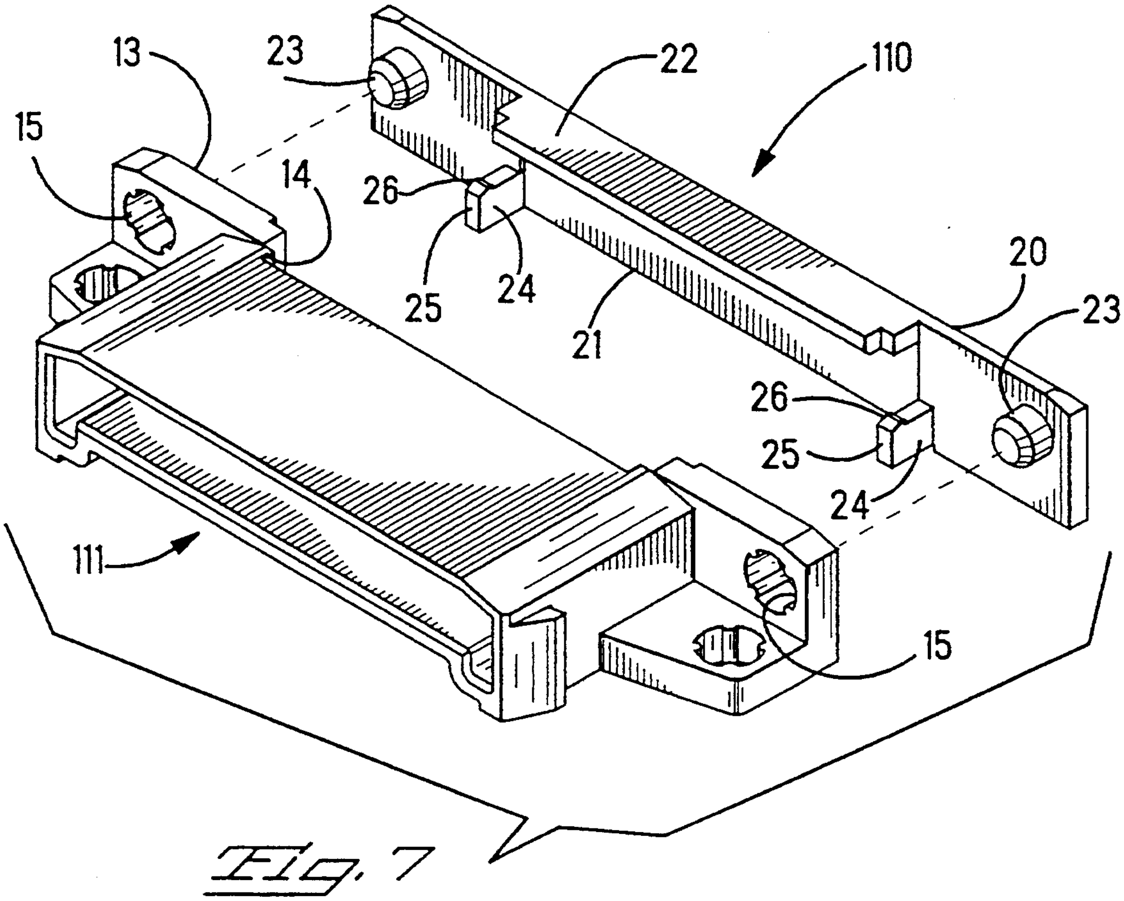
FIG. 7 is an exploded perspective view of an alternate embodiment of the safety shield being connected to the header.

The latching finger 24 may be L-shaped in which the base 25 is oriented outwardly toward the pins 23 (FIGS. 2 and 4). Alternately, the base 25 may be oriented upwardly toward the ledge 22 (FIG. 7).

Figure 8:
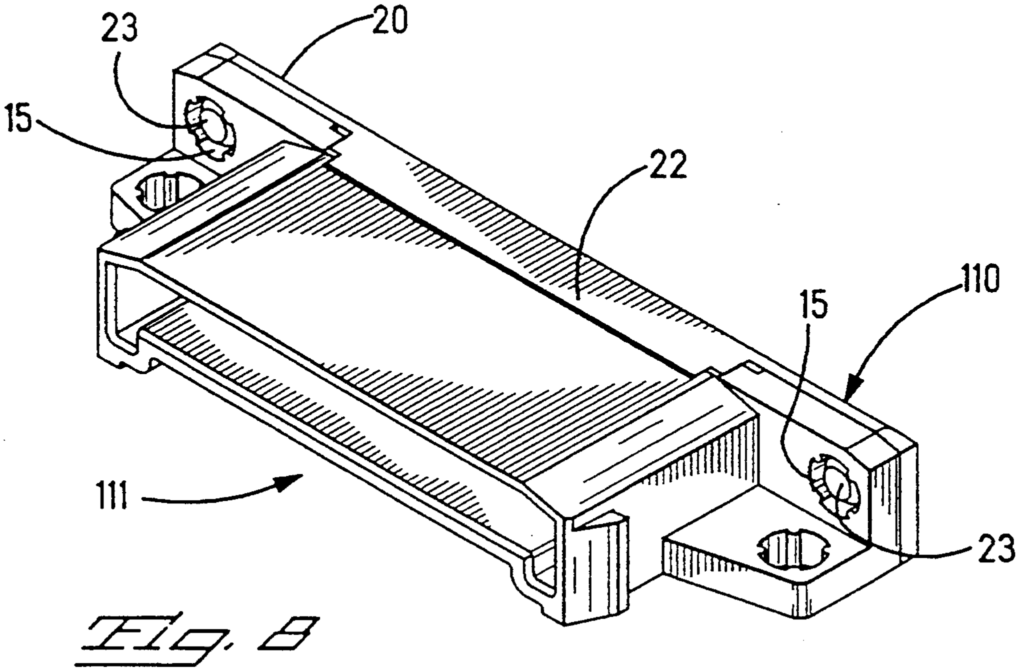
FIG. 8 is a perspective view of the embodiment of FIG. 7 connected to the header.

In the alternate upwardly oriented embodiment of the base 25, there are two means of securing the safety shield 110 to the header 111. One means is for the latching finger 24 to be received in a channel 16 as described above. The other means is for each of the latching fingers 24 to be formed on the edge of the body 20 opposite from the ledge 22 with the respective base 25 oriented toward the ledge 22. The base 25 may be viewed as a protrusion on the latching finger 24. When the safety shield 110 is connected to the header 111, the latching fingers 24 are disposed adjacent to the header 111 outside of the header 111 on a side opposite from the notch 14 in the header. The protrusion 25 engages the outside of the header 111. In this manner, the ledge 22 and the latching fingers 24 engage both sides of the header 111 and secure the safety shield 110 to the header 111 (FIGS. 7 and 8).

The present invention is a simple, cost effective device which can easily be connected and secured to a right angle header to effectively cover the electrical terminals and prevent injury to persons using electrical equipment. The present invention may be installed during the initial assembly of the electrical equipment or it may be retroactively fitted to the electrical equipment.

It is thought that the safety shield of the present invention and many of its attendant advantages will be understood from the foregoing description. It is apparent that various changes may be made in the form, construction, and arrangement of parts thereof without departing from the spirit or scope of the invention, or sacrificing all of its material advantages.

What is claimed is:

1. A safety shield for a header, wherein a plurality of electrical terminals extend from an end of the header, the electrical terminals bent at an angle of approximately 90° from the end of the header, the shield protecting the electrical terminals from inadvertent access, the end of the header having a lateral notch formed therein, the notch extending over the electrical terminals, the end of the header further having a pair of spaced-apart openings formed therein:

the safety shield comprising an insulated body having a center portion, a ledge formed at approximately the center portion of the body, and the ledge extending outwardly at approximately a right angle to the body, the body of the safety shield having a pair of spaced-apart pins formed therein, said pins being adapted to be received in and cooperate with said openings of said header when said safety shield is connected to the end of the header, whereby when the safety shield is secured to the header, the body of the shield extends laterally across the end of the header, and the ledge on the body is received in the notch in the header such that the electrical terminals extending from the end of the header are covered.

2. The safety shield of claim 1, further comprising the end of the header having at least two spaced-apart channels formed therein, the body of the safety shield having at least two flexible latching fingers formed thereon, wherein when the safety shield is connected to the end of the header, the at least two latching fingers on the body are received in the at least two channels in the end of the header to secure the safety shield to the header.

3. The safety shield of claim 2, wherein the at least two latching fingers each are L-shaped and each extends outwardly from the body, each L-shaped finger having a base distal from the body, the base of each finger being formed with an obtuse angle angling from the base toward the body wherein each base may be slidably guided into and received in the respective channel in the header and thereby securing the safety shielded to the header.

4. The safety shield of claim 1, further comprising the body of the safety shield having at least two spaced-apart flexible latching fingers formed thereon, each latching finger extending outwardly from the body, each latching finger having an end distal from the body, the end of each finger having a protrusion directed upwardly toward the ledge on the body, wherein when the safety shield is connected to the header, the latching fingers extend adjacent to the header and the protrusion on the respective latching fingers engage the header such that the header is secured between the ledge and the latching fingers on the body.

* * * * *